US006380059B1

(12) United States Patent
Ho et al.

(10) Patent No.: US 6,380,059 B1
(45) Date of Patent: Apr. 30, 2002

(54) METHOD OF BREAKING ELECTRICALLY CONDUCTIVE TRACES ON SUBSTRATE INTO OPEN-CIRCUITED STATE

(75) Inventors: Tzong-Da Ho, No.16, Alley 4, Lane 226, Peitun Road, Taichung; Chien-Ping Huang, No.8, Lane 26, Kangchuang Road, Chutun Chen, Hsinchu Hsien; Chiao-Yi Lee, 6-3F1., No.460, Yatang, road, Taya Hsiang, Taichung, Hsien, all of (TW)

(73) Assignees: Tzong-Da Ho (TW); Chien-Ping Huang (TW); Chiao-Yi Lee (TW)

( * ) Notice: Subject to any disclaimer, the term of this patent is extended or adjusted under 35 U.S.C. 154(b) by 0 days.

(21) Appl. No.: 09/638,593

(22) Filed: Aug. 15, 2000

(51) Int. Cl.[7] .................................................. H01L 21/44
(52) U.S. Cl. ....................... 438/601; 438/122; 438/125; 438/599
(58) Field of Search ................................. 438/601, 122, 438/125, 117, 599

(56) References Cited

U.S. PATENT DOCUMENTS 5,731,709 A * 3/1998 Pastore et al.

* cited by examiner

*Primary Examiner*—Kevin M. Picardát
*Assistant Examiner*—D. M. Collins

(57) ABSTRACT

A method is proposed for use to break integrally-connected electrically-conductive traces on a circuited substrate used in TFBGA (Thin & Fine Ball Grid Array) semiconductor packaging technology, so as to make the electrically-conductive traces open-circuited for the implementation of open-circuited testing on the electrically-conductive traces on the substrate. The proposed method is characterized in the forming of a resistively-enlarged point at the terminal of each electrically-conductive trace on the substrate, which can be melted away while leaving each electrically-conductive trace intact simply by applying an electrical current of an adequate magnitude to pass through each electrically-conductive trace. As each electrically-conductive trace is open-circuited, an open-circuited testing procedure can be then performed on the electrically-conductive on the substrate.

8 Claims, 2 Drawing Sheets

METHOD OF BREAKING ELECTRICALLY CONDUCTIVE TRACES ON SUBSTRATE INTO OPEN-CIRCUITED STATE

BACKGROUND OF THE INVENTION

1. Field of the Invention:

This invention relates to semiconductor packaging technology, and more particularly, to a method for breaking integrally-connected electrically-conductive traces on a circuited substrate used in TFBGA (Thin & Fine Ball Grid Array) semiconductor packaging technology into open-circuited state, for the purpose of facilitating the implementation of open-circuited testing on the electrically-conductivetraces mounted on the substrate.

2. Description of Related Art:

BGA (Ball Grid Array) is an advanced type of semiconductor packaging technology which is characterized in the mounting of a two-dimensional array of solder balls on the bottom surface of the substrate on which a semiconductor chip is mounted. These solder balls allow the entire package body to be mechanically bonded and electrically coupled to an external printed circuit board (PCB).

TFBGA (Thin & Fine Ball Grid Array) is a downsized type of BGA technology that provides semiconductor device packages in very small sizes, which are customarily fabricated in batch from a single chip carrier, such as a substrate, predefined with a matrix of package sites, from which an individual TFBGA package unit is obtained by singulating each package site. The TFBGA substrate is formed with a plurality of electrically-conductive traces which are used for electrically connecting the semiconductor chip on the substrate to external printed circuit board.

By the present TFBGA fabrication technology, since it is required to plate gold onto the electrically-conductive traces on the substrate, they are all integrally connected to a common plating bar, so that during plating process, electricity can be applied through the plating bar to all the electrically-conductive traces.

FIG. 1 shows a conventional circuit layout on a TFBGA substrate 10. As shown, this substrate 10 is partitioned into a plurality of package sites 11 which are separated from each other by crosswise and lengthwise intercrossed plating bars 20 (these plating bars 20 will be entirely cut away and discarded in the final step of the fabrication). Each package site 11 is used for the mounting of at least one semiconductor chip 30 thereon, so that each package site 11 can be singulated as an individual package unit in the final step. The semiconductor chip 30 is electrically connected to a plurality of electrically-conductive traces 40 formed over each package site 11 of the substrate 10.

Since it is required to perform a gold-plating process on the electrically-conductive traces 40, all the respective terminals 40a of the electrically-conductive traces 40 are connected by design to the plating bar 20, so that during plating process, electricity can be applied through the plating bar 20 to all the electrically-conductive traces 40.

When the semiconductor chip 20 is prior to mounted in position on the substrate 10, it is required to perform a short-circuited testing procedure and an open-circuited testing procedure for the purpose of checking whether the electrically-conductive traces 40 of the substrate 10 operates properly.

During the short-circuited testing procedure, the electrically-conductive traces 40 should be short-circuited to each others whereas, during the open-circuited testing procedure, they should be open-circuited from each other.

Since the respective terminals 40a of the electrically-conductive traces 40 are all originally connected to the plating bar 20, the electrical-conductive traces 40 are effectively short-circuited to each other; and therefore, they are readily set for the short-circuited testing procedure.

However, during the open-circuit testing procedure, it is required to break the electrically-conductive traces 40 apart from the plating bar 20 so as to make the electrically-conductive traces 40 open-circuited.

A feasible method for breaking the integrally-connected electrically-conductive traces 40 apart from the plating bar 20 is to use etchant to etch away the junction part between each plating bar 20 and each electrically-conductive trace 40, so as to make each electrically-conductive trace 40 open-circuited at its terminal 40a.

The foregoing solution, however, has the following drawbacks. Firstly, the involved etching process would undesirably make the overall fabrication process more complex and costly to implement, and also undesirably increase the cycle time of the overall fabrication process. Secondly, the use of etchant would easily cause contamination to the substrate surface, which may degrade the performance and reliability of the circuitry formed over the substrate.

SUMMARY OF THE INVENTION

It is therefore an objective of the present invention to provide a method for breaking electrically-conductive traces on substrate into open-circuited state, which can be implemented without having to use etchant, so that the overall TFBGA fabrication can be simplified and thus cost-effective to implement.

It is another objective of the present invention that the proposed method would not cause contamination to substrate surface.

It is still another objective of the present invention that the proposed method can be implemented without increasing the overall cycle time of the fabrication process.

In accordance with the foregoing and other objectives, the invention proposes a new method for breaking electrically-conductive traces on substrate into open-circuited state.

The method of the invention comprises the following steps: (1) forming a resistively-enlarged point at the terminal of each of the electrically-conductive traces, the resistively-enlarged point being higher in electrical resistance than each of the electrically-conductive traces; and (2) applying an electrical current to pass through each of the electrically-conductive traces, the electrical current being adequate enough in magnitude to melt the resistively enlarged point while leaving each of the electrically-conductive traces intact, thereby making each of the electrically-conductive traces open-circuited.

The resistively-enlarged point can be realized either by constricting the terminal of each electrically-conductive trace, or by coating an electrically-resistive material onto the terminal of each electrically-conductive trace.

The method of the invention allows the electrically-conductive traces on the substrate to be made open-circuited simply by applying an adequate electrical current to pass through the electrically-conductive traces, which is easy to carry out without using expensive equipment, making the overall fabrication process more cost-effective to implement then the prior art. Moreover, the method of the invention will substantially cause no contamination to the substrate surface as in the case of the prior art.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

The invention provides a method for breaking electrically-conductive traces on a circuited substrate into open-circuited state, which is characterized in that a resistively-enlarged point is provided at the terminal of each of the electrically-conductive traces, whose electrical resistance is significantly greater than the electrically-conductive traces, so that it can be easily melted away by applying an adequate electrical current through the electrically-conductive traces, while leaving the electrically-conductive traces intact.

In accordance with the foregoing concept, two preferred embodiments are disclosed in full details in the following with reference to FIGS. 2A–2B and FIGS. 3A–3C respectively.

Figure 2A:
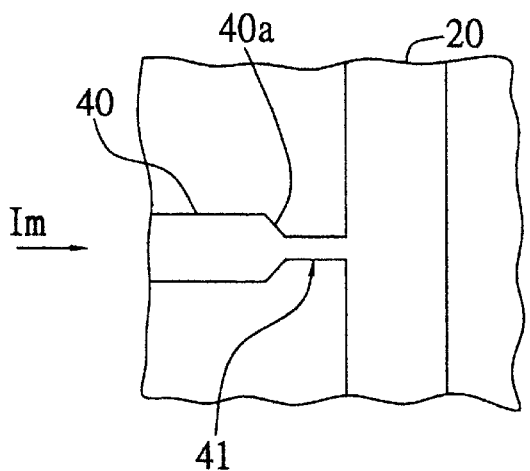
FIG. 2A is a schematic top view of a single electrically-conductive trace formed with a resistively-enlarged point according to the first preferred embodiment of the method of the invention.
Figure 2B:
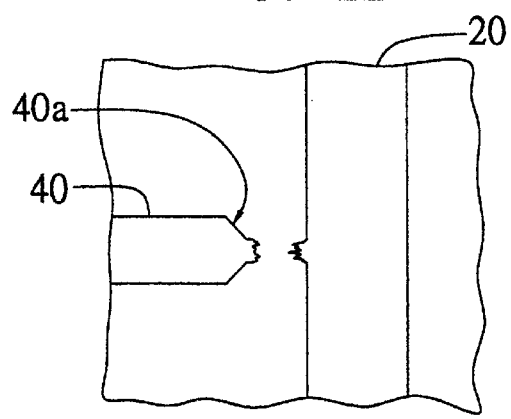
FIG. 2B shows the same of FIG. 2A except when the resistively-enlarged point is melted away.

First Preferred Embodiment (FIGS. 2A–2B)

The first preferred embodiment of the method of the invention is disclosed in full details in the following with reference to FIGS. 2A–2B.

As shown in FIG. 2A, in this embodiment, the terminal 40a of each electrically-conductive trace 40 is narrowed by layout design into a constricted segment 41. Preferably, the constricted segment 41 is made as narrow as possible, depending on the capability of the present substrate fabrication technology.

From fundamental electrical principle, it can be learned that, since the constricted segment 41 has a reduced cross section as compared to the adjoining electrically-conductive trace 40, the constricted segment 41 is significantly greater in electrical resistance than the adjoining electrically-conductive trace 40; and as a result, when an electrical current is being applied to pass through the electrically-conductive trace 40 and the constricted segment 41, the constricted segment 41 would generate more heat than the electrically-conductive trace 40.

During the open-circuited testing procedure, an electrical current $I_m$ is first applied to pass through the electrically-conductive trace 40 and the constricted segment 41, whose magnitude should be adequate enough to melt the constricted segment 41 while leaving the electrically-conductive trace 40 intact. The exact magnitude of $I_m$ can be predetermined through actual experiments.

As shown in FIG. 2B, as the constricted segment 41 is melted away, the adjoining electrically-conductive trace 40 is broken apart from the plating bar 20 and thus electrically disconnected from the plating bars 20, thereby putting the terminal 40a of the electrically-conductive trace 40 into open-circuited state.

Figure 1:
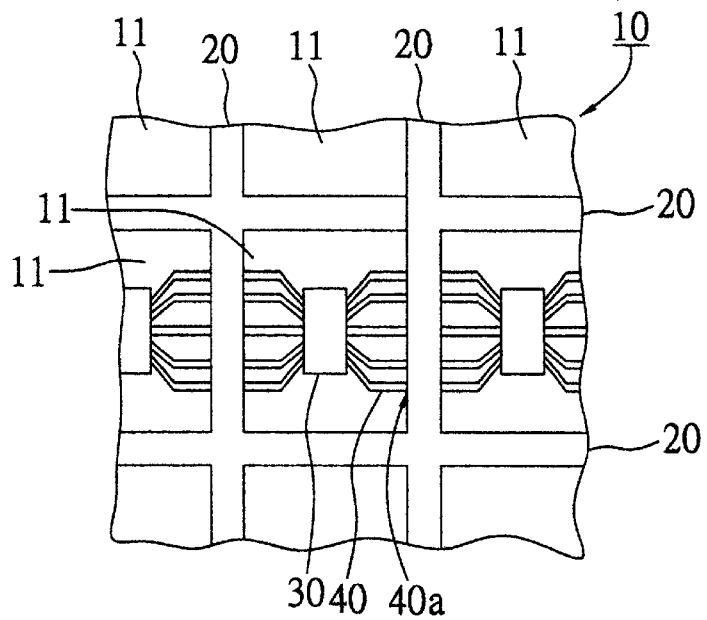
FIG. 1 (PRIOR ART) shows a schematic top view of a typical TFBGA substrate.

As the electrically-conductive trace 40 is open-circuited, an open-circuited testing procedure can be performed to the electrically-conductive trace 40 on the substrate 10 chip 30 (shown in FIG. 1). The open-circuited testing procedure employs conventional technique and is not within the spirit and scope of the invention, so description thereof will not be further detailed.

Figure 3A:
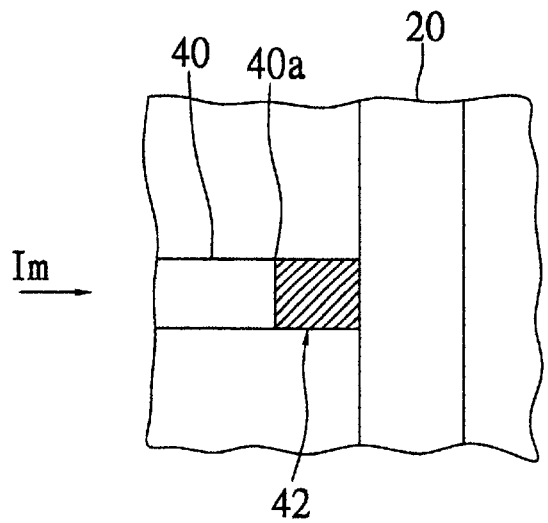
FIG. 3A is a schematic top view of a single electrically-conductive trace formed with a resistively-enlarged point according to the second preferred embodiment of the method of the invention.
Figure 3B:
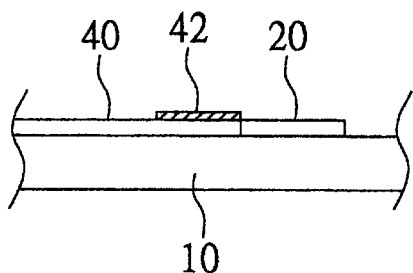
FIG. 3B shows a schematic sectional view of the same of FIG. 3A.
Figure 3C:
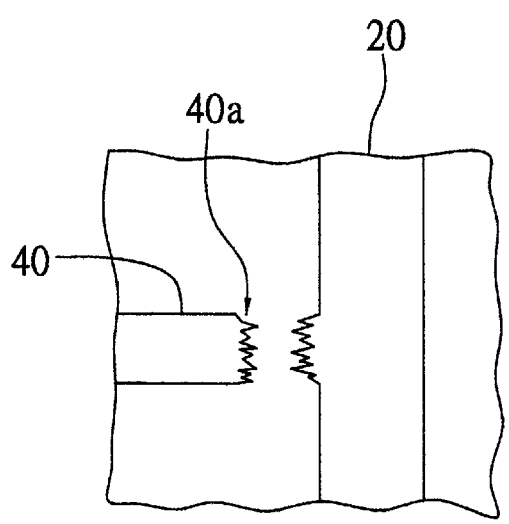
FIG. 3C shows the same of FIG. 3A except the resistively enlarged point is melted away.

Second Preferred Embodiment (FIGS. 3A–3C)

The second preferred embodiment of the method of the invention is disclosed in full details in the following with reference to FIGS. 3A–3C. In FIGS. 3A–3C, the same parts as the previous embodiment are labeled with the same reference numerals.

As shown in FIG. 3A and FIG. 3B, in this embodiment, an electrically-resistive material 42 is coated to the terminal 40a of each electrically-conductive trace 40, which is significantly greater in electrical resistance than the electrically-conductive trace 40, whereby the terminal 40a of each electrically-conductive trace 40 is turned into a resistively-enlarged point.

During the open-circuited testing procedure, an electrical current $I_m$ is first applied to pass through the electrically-conductive trace 40 and the resistively-coated part 42, whose magnitude should be adequate enough to melt the resistively-coated part 42 while leaving the other part of the electrically-conductive trace 40 intact. The exact magnitude of $I_m$ can be predetermined through actual experiments.

As shown in FIG. 3C, as the resistively-coated part 42 is melted away, the adjoining electrically-conductive trace 40 is broken apart from the plating bar 20 and thus electrically disconnected from the plating bars 20, thereby putting the terminal 40a of the electrically-conductive trace 40 into open-circuited state.

As the electrically-conductive trace 40 is open-circuited, an open-circuited testing procedure can be performed to the electrically-conductive trace 40 on the substrate 10 (shown in FIG. 1). The open-circuited testing procedure employs conventional technique and is not within the spirit and scope of the invention, so description thereof will not be further detailed.

CONCLUSION

In conclusion, the method of invention is characterized in the provision of an resistively-enlarged point in each of the electrically-conductive traces on the substrate, which is significantly greater in electrical resistance than the electrically-conductive traces, so that it can be easily melted away by applying an adequate electrical current through the electrically-conductive traces.

Compared to the prior art, since the application of the required electrical current to melt away the resistively-enlarged point is easy to carry out without having to using etchant and expensive equipment, the invention allows the overall fabrication process to be more cost-effective to implement than the prior art. Moreover, the method of the invention will substantially cause no contamination to the substrate surface as in the case of the prior art. These benefits make the method of the invention more advantageous in utilization value than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for use on a circuited substrate having a set of integrally-connected electrically-conductive traces, each having a terminal connected to a common plating bar, for breaking the electrically-conductive traces into open-circuited state;

the method comprising the steps of:
(1) forming a resistively-enlarged point at the terminal of each of the electrically-conductive traces, the resistively-enlarged point being higher in electrical resistance than each of the electrically-conductive traces; and
(2) applying an electrical current to pass through each of the electrically-conductive traces, the electrical current being adequate enough in magnitude to melt the resistively-enlarged point while leaving each of the electrically-conductive traces intact, thereby making each of the electrically-conductive traces open-circuited.

2. The method of claim 1, wherein the electrically-conductive traces are plated with gold through the plating bar.

3. The method of claim 1, wherein the resistively-enlarged point is realized by providing a constricted segment at the terminal of each of the electrically-conductive traces.

4. The method of claim 1, wherein the resistively-enlarged point is realized by coating an electrically-resistive material onto the terminal of each of the electrically-conductive traces.

5. A method for use on a circuited substrate having a set of integrally-connected electrically-conductive traces, each having a terminal connected to a common plating bar, for breaking the electrically-conductive traces into open-circuited state;

the method comprising the steps of:
(1) forming a resistively-enlarged point at the terminal of each of the electrically-conductive traces by providing a constricted segment at the terminal of each of the electrically-conductive traces; and
(2) applying an electrical current to pass through the electrically-conductive traces, the electrical current being adequate enough in magnitude to melt the resistively-enlarged point while leaving the electrically-conductive traces intact.

6. The method of claim 5, wherein the electrically-conductive traces are plated with gold through the plating bar.

7. A method for use on a circuited substrate having a set of integrally-connected electrically-conductive traces, each having a terminal connected to a common plating bar, for breaking the electrically-conductive traces into open circuited state;

the method comprising the steps of:
(1) forming a resistively-enlarged point at the terminal of each of the electrically-conductive traces by coating an electrically-resistive material onto the terminal of each of the electrically-conductive traces; and
(2) applying an electrical current to pass through the electrically-conductive traces, the electrical current being adequate enough in magnitude to melt the resistively-enlarged point while leaving the other part of each of the electrically-conductive traces intact.

8. The method of claim 7, wherein the electrically-conductive traces are plated with gold through the plating bar.

* * * * *

UNITED STATES PATENT AND TRADEMARK OFFICE
CERTIFICATE OF CORRECTION

PATENT NO.    : 6,380,059 B1
DATED         : April 30, 2002
INVENTOR(S)   : Ho et al.

It is certified that error appears in the above-identified patent and that said Letters Patent is hereby corrected as shown below:

<u>Title page,</u>
Item [73], Assignee:, change "Tzong-Da Ho (TW); Chien-Ping Huang (Tw) and Chiao-Yi Lee (TW)" to -- Siliconware Precision Industries Co., Ltd. (TW) --.

Signed and Sealed this

Twentieth Day of August, 2002

Attest:

JAMES E. ROGAN
Attesting Officer      *Director of the United States Patent and Trademark Office*